United States Patent
Chen et al.

(10) Patent No.: US 6,496,341 B1
(45) Date of Patent: Dec. 17, 2002

(54) SOI ELECTROSTATIC DISCHARGE PROTECTION CIRCUIT

(75) Inventors: Shiao-Shien Chen, Chung-Li (TW); Tien-Hao Tang, Taipei Hsien (TW)

(73) Assignee: United Microelectronics Corp., Hsinchu (TW)

(*) Notice: Subject to any disclaimer, the term of this patent is extended or adjusted under 35 U.S.C. 154(b) by 309 days.

(21) Appl. No.: 09/624,169

(22) Filed: Jul. 24, 2000

(30) Foreign Application Priority Data

Jul. 13, 2000 (TW) .................................. 89113939 A

(51) Int. Cl.$^7$ ............................................. H02H 9/00
(52) U.S. Cl. ........................ 361/56; 327/306; 330/277
(58) Field of Search ........................ 361/56, 58, 91.5, 361/98, 111, 91; 257/357, 360; 327/328, 306, 437, 319; 330/264, 277, 298

(56) References Cited

U.S. PATENT DOCUMENTS

| | | | | |
|---|---|---|---|---|
| 3,947,727 A | * | 3/1976 | Stewart | 361/91.5 |
| 4,607,274 A | * | 8/1986 | Yoshitake | 257/357 |
| 4,990,802 A | * | 2/1991 | Smooha | 361/91 |
| 5,041,741 A | * | 8/1991 | Steele | 327/559 |
| 5,264,723 A | * | 11/1993 | Strauss | 257/532 |

* cited by examiner

Primary Examiner—Rajnikant B. Patel

(57) ABSTRACT

A silicon-on-insulator (SOI) electrostatic discharge (ESD) protection circuit. The SOI ESD protection circuit has a first and a second diode, a first and a second NMOS transistor and a first and a second PMOS transistor. The input terminal of the first diode is coupled to the bonding pad while the output terminal is coupled to a voltage source. The input terminal of the second diode is coupled to an earth voltage while the output terminal is coupled to the bonding pad. Both the source terminal and the gate terminal of the first NMOS transistor are coupled to the earth voltage. The drain terminal of the first NMOS transistor is coupled to the voltage source. Both the source and the gate terminal of the second NMOS transistor are coupled to the earth voltage. Both the source and the gate terminal of the first PMOS transistor are coupled to the voltage source. The drain terminal of the first PMOS transistor is coupled to the substrate of the first NMOS transistor. Both the source terminal and the gate terminal of the second PMOS transistor are coupled to the voltage source. The drain terminal of the second PMOS transistor is coupled to the earth voltage. The substrate of the second PMOS transistor is coupled to the drain terminal of the second NMOS transistor. The SOI ESD protection circuit utilizes substrate triggering to boost performance and robustness.

2 Claims, 4 Drawing Sheets

SOI ELECTROSTATIC DISCHARGE PROTECTION CIRCUIT

CROSS-REFERENCE TO RELATED APPLICATION

This application claims the priority benefit of Taiwan application serial no.89113939, filed Jul. 13, 2000.

BACKGROUND OF THE INVENTION

1. Field of Invention

The present invention relates to an electrostatic discharge (ESD) protection circuit. More particularly, the present invention relates to a silicon-on-insulator (SOI) electrostatic discharge protection circuit (SOI ESD) having a substrate capable of triggering the opening of a bipolar junction transistor so that performance of the ESD protection circuit is improved.

2. Description of Related Art

Electrostatic discharge during manufacture and post-manufacture transportation is a leading cause of damage to integrated circuits (IC) such as dynamic random access memory (DRAM) and static random access memory (SRAM). For example, a person walking on a carpet in a high relative humidity environment can generate several hundred to several thousand volts of static electricity. Under exceptionally dry conditions, a charge of up to ten thousand volts is possible. When the charged body makes contact with a silicon chip, static electricity may discharge causing irreparable damage to the chip. To reduce damage to the chip due to electrostatic discharge, hard-wired electrostatic discharge circuits are often provided. In other words, an on-chip electrostatic discharge protection circuit is formed between the internal circuit and each bonding pad.

In general, thickness of the gate oxide layer increases with the degree of integration. As circuit devices continue to miniaturize, breakdown voltage of the gate oxide layer is fast approaching or even lower than the source/drain junction breakdown voltage. Under such circumstances, performance of the original ESD protection circuit will be greatly compromised. In addition, most internal circuits are designed according to the minimum design rules. The minimum design rules are often prescribed without due regard for combating a large transient current (for example, sufficient space must be set aside between contact and edge of a diffusion region and between contact and edge of a gate). Hence, silicon chips are more vulnerable to electrostatic damage if the level of integration is high. In fact, electrostatic discharge has become one of the major problems in deep-submicron integrated circuitry. Consequently, means of improving the performance of ESD protection circuit is currently high on the list of innovations in the semiconductor industry.

Silicon-on-insulator (SOI) is a widely used technology for forming integrated circuits. Compared with devices formed on a bulk wafer, devices formed on an SOI composite layer have better functional properties. For example, SOI devices consume little power and have a low threshold operating voltage. The functional properties of devices formed on the bulk wafer are critically affected by the formation of inherent parasitic capacitance at the junctions of silicon devices. However, silicon devices of the SOI type are formed above an insulator. Hence, inherent parasitic capacitance is mostly removed. Due to the considerable reduction of parasitic capacitance, devices fabricated according to SOI technology consume less power and have a higher operating speed at a pre-defined device dimension.

In general, silicon-on-insulator (SOI) technology is characterized by the formation of an insulation layer between a bulk wafer and a top silicon layer. All the devices are formed on the top silicon layer. Arranging silicon devices on top of an insulation layer prevents latch-up of CMOS, which reduces the possibility of soft error associated with MOS and increases the operating speed of the circuits.

These benefits notwithstanding, the conventional SOI ESD protection circuit has heat dissipation problems. Hence, the performance of ESD protection circuit is usually low. Although inserting a diode string between the VDD and the VSS terminal is able to raise ESD performance and robustness, the additional diode string occupies considerable surface area. FIG. 1 is the circuit diagram of a conventional SOI ESD protection circuit. As shown in FIG. 1, the SOI ESD protection circuit 10 is positioned between a bonding pad 12 and an input buffer 14. The protection circuit 10 consists of a first diode 16 and a second diode 18 and an NMOS transistor 20. The input terminal of the first diode 16 is connected to the bonding pad 12 and the output terminal of the first diode 16 is connected to a voltage source VDD. The input terminal of the second diode 18 is connected to an earth voltage VSS and the output terminal of the second diode 18 is connected to the bonding pad 12. The source terminal of the NMOS transistor 20 is connected to the source voltage VDD. The gate terminal and the drain terminal of the NMOS transistor 20 are connected to the earth voltage VSS. In addition, the output terminal of the input buffer 14 is coupled to the internal circuit (not shown) inside the chip. The input buffer 14 consist of an NMOS transistor 22 and a PMOS transistor 24 that are serially connected together.

The circuit in FIG. 1 can be transformed into the one shown in FIG. 2. In FIG. 2, a diode string 26 replaces the NMOS transistor 20 in FIG. 1. The diode string 26 consists of a plurality of serially connected diodes. The input terminal of the diode string 26 is coupled to the voltage source VDD and the output terminal of the diode string 26 is coupled to the earth voltage VSS.

In the SOI ESD circuit structures shown in FIGS. 1 and 2, the gated NMOS transistor 20 and the diode string 26 are respectively used between VDD and VSS. In general, if a gated NMOS transistor such as the one shown in FIG. 1 is used, problems related to heat diffusion of the SOI substrate often lead to a drop in robustness of the ESD protection circuit. This problem can be mitigated, but at the expense of additional surface area. Similarly, if a diode string such as the one shown in FIG. 2 is used, then the diode string must contain many diodes to prevent current leakage. Hence, this method also requires consumes more surface area.

SUMMARY OF THE INVENTION

Accordingly, one objective of the present invention is to provide a silicon-on-insulator (SOI) electrostatic discharge (ESD) protection circuit between a bonding pad and an input buffer. The SOI ESD protection circuit includes two diodes, two NMOS transistors and two PMOS transistors. The input terminal of the first diode is coupled to the bonding pad while the output terminal is coupled to a voltage source. The input terminal of the second diode is coupled to an earth voltage while the output terminal is coupled to the bonding pad. Both the source terminal and the gate terminal of the first NMOS transistor are coupled to the earth voltage. The drain terminal of the first NMOS transistor is coupled to the voltage source. Both the source and the gate terminal of the second NMOS transistor are coupled to the earth voltage. Both the source and the gate terminal of the first PMOS transistor are coupled to the voltage source. The drain terminal of the first PMOS transistor is coupled to the substrate of the first NMOS transistor. Both the source terminal and the gate terminal of the second PMOS transistor are coupled to the voltage source. The drain terminal of the second PMOS transistor is coupled to the earth voltage. The substrate of the second PMOS transistor is coupled to the drain terminal of the second NMOS transistor.

The SOI ESD protection circuit of this invention is capable of boosting ESD protection performance and robustness. A positive stress relative to the earth voltage or a negative stress relative to the voltage source is able to trigger the parasitic bipolar junction transistor inside the SOI ESD protection circuit into an open state early on. Hence, the electrostatic stress can be discharged to the earth or the voltage source through the triggering action at the junction between the substrate and the source region of the first NMOS transistor or the second PMOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
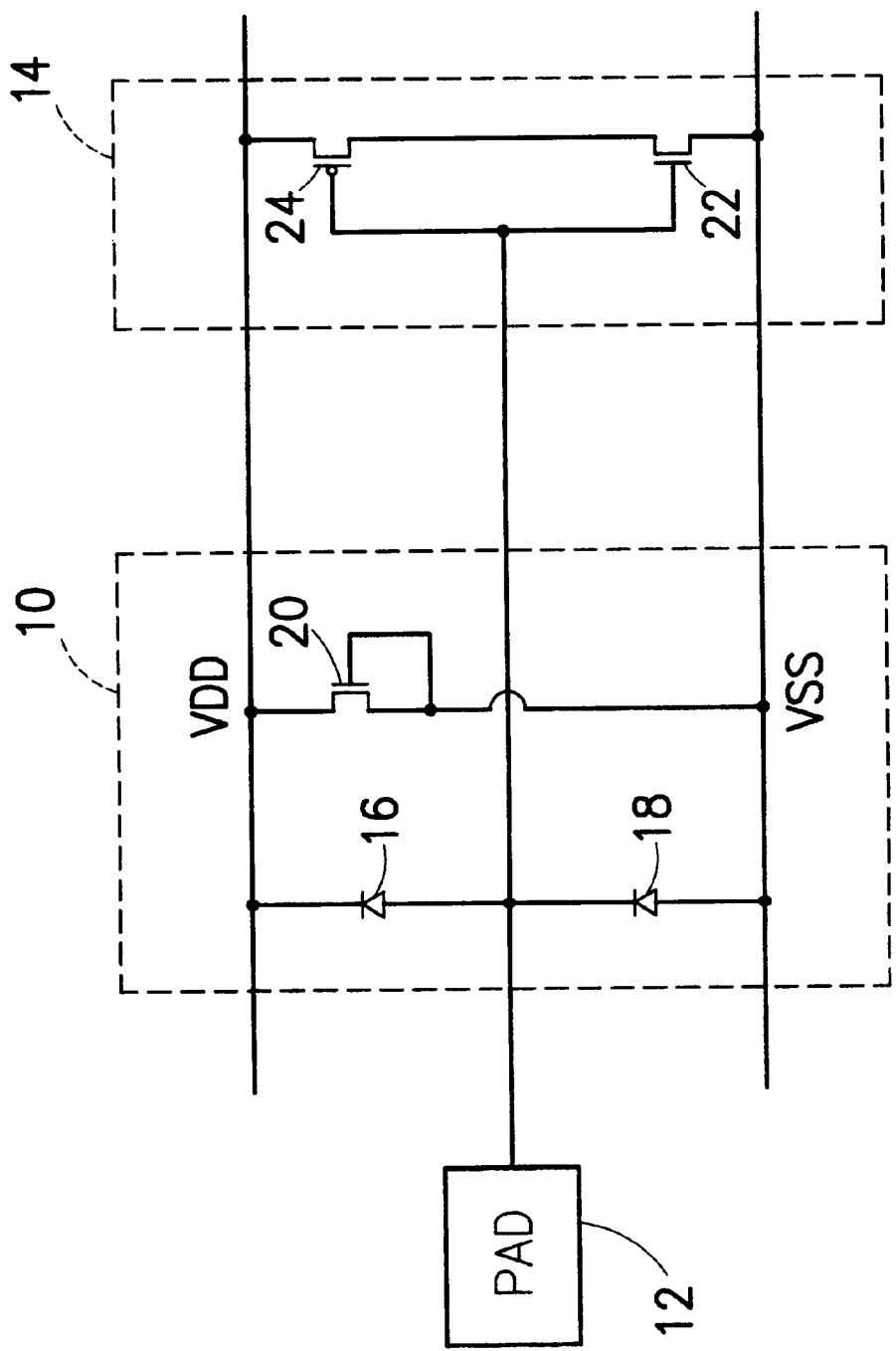
FIG. 1 is the circuit diagram of a conventional SOI ESD protection circuit.
Figure 2:
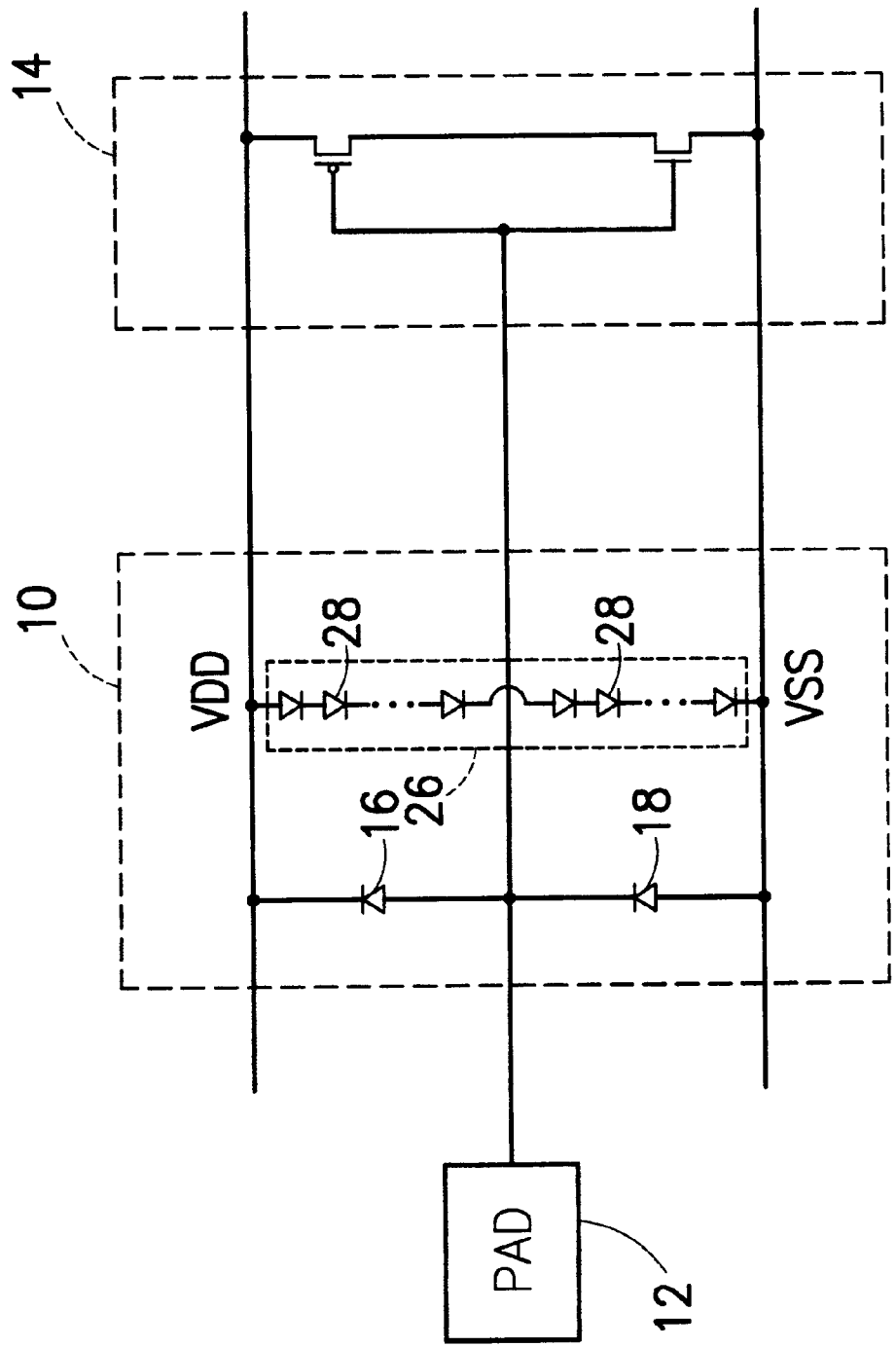
FIG. 2 is the circuit diagram of another conventional SOI ESD protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
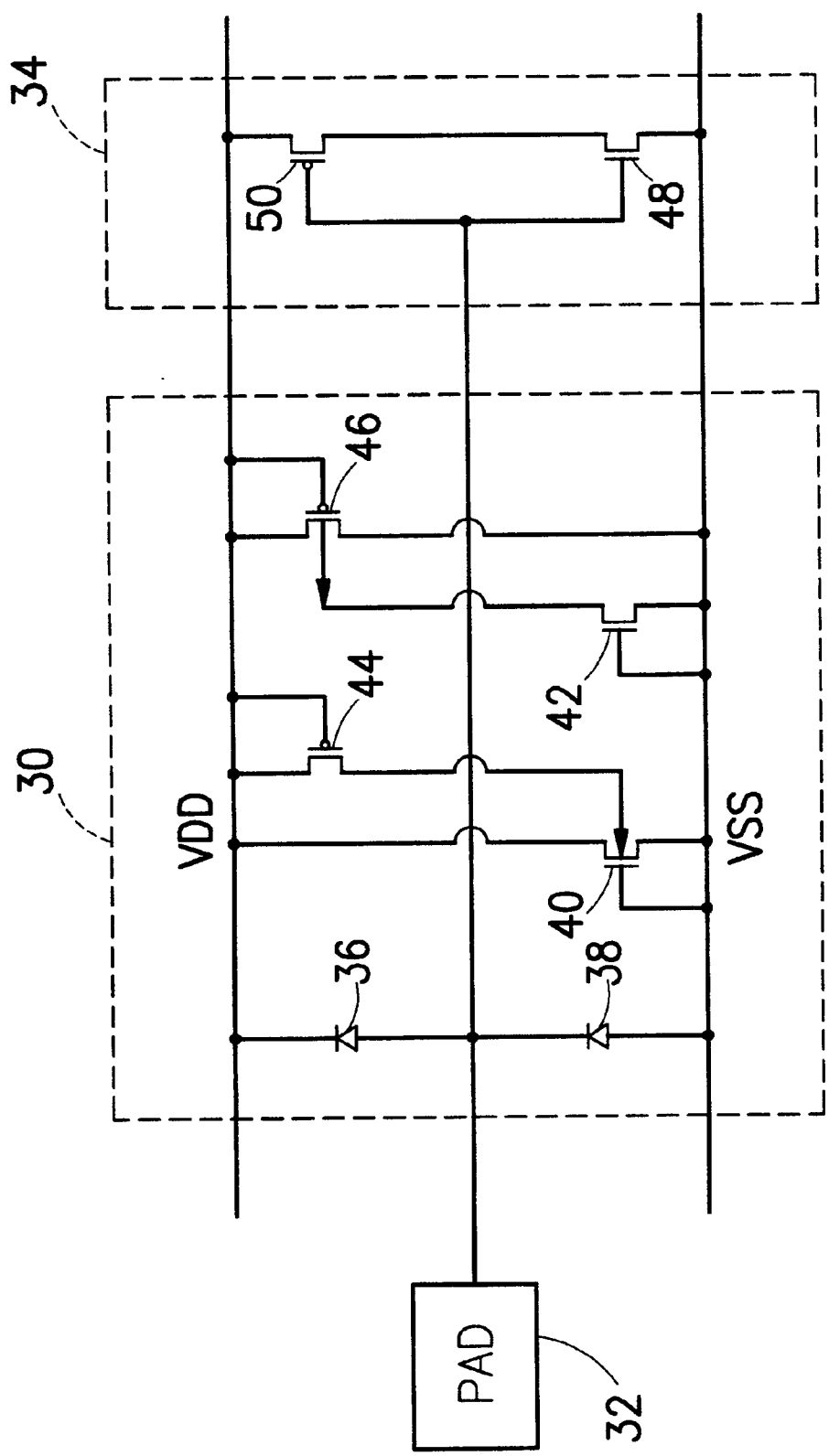
FIG. 3 is a circuit diagram of a SOI ESD protection circuit according to one preferred embodiment of this invention.

FIG. 3 is a circuit diagram of a SOI ESD protection circuit according to one preferred embodiment of this invention. As shown in FIG. 3, the SOI ESD protection circuit 30 is positioned between a bonding pad 32 and an input buffer 34. The SOI ESD protection circuit 30 includes two diodes 36 and 38, two NMOS transistors 40 and 42 and two PMOS transistors 44 and 46.

The input terminal of the diode 36 is coupled to the bonding pad while the output terminal is connected to a voltage source VDD. The input terminal of the diode 38 is connected to an earth voltage VSS while the output terminal is connected to the bonding pad 32. Both the gate terminal and the source terminal of the NMOS transistor 40 are connected to the earth voltage VSS. The drain terminal of the NMOS transistor 40 is connected to the source voltage VDD. Both the source terminal and the gate terminal of the NMOS transistor 42 are connected to the earth voltage VSS. The drain terminal of the NMOS transistor 42 is connected to the substrate of the PMOS transistor 46. Both the source terminal and the gate terminal of the PMOS transistor 44 are connected to the source voltage VDD. The drain terminal of the PMOS transistor 44 is connected to the substrate of the NMOS transistor 40. Both the source terminal and the gate terminal of the PMOS transistor 46 are connected to the source voltage VDD. The drain terminal of the PMOS transistor 46 is connected to the earth voltage VSS. In addition, the output terminal of the input buffer 34 is connected to an internal circuit (not shown) inside the silicon chip. The input buffer 34 comprise an NMOS transistor 48 and a PMOS transistor 50 that are serially connected together.

If there is an electrostatic discharge, for example, a positive stress relative to the voltage source VDD, the diode 36 becomes conductive and forms a discharge route between the bonding pad 32 and the voltage source VDD. Hence, any positive stress applied to the bonding pad 32 is discharged via the voltage source pad VDD.

Figure 4:
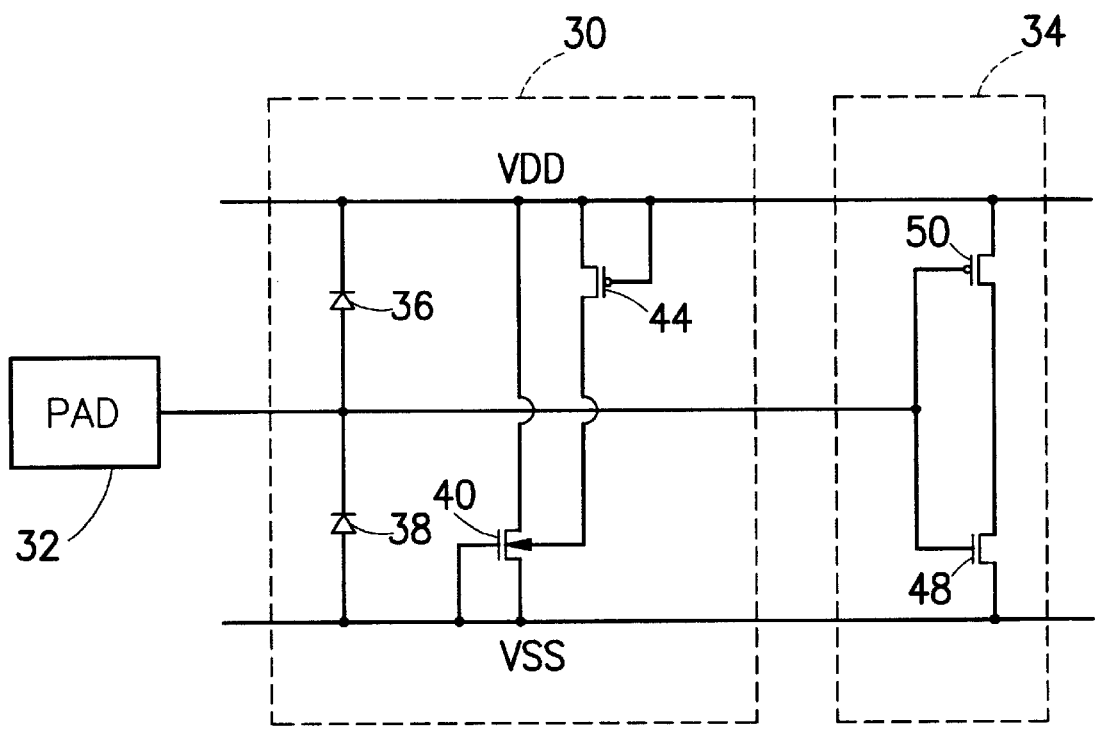
FIG. 4 is a circuit diagram showing the SOI ESD protection circuit of this invention under a positive electrostatic stress relative to earth.

Likewise, an electrostatic discharge due to positive stress relative to the earth voltage VSS may occur. FIG. 4 is a circuit diagram showing the SOI ESD protection circuit of this invention under a positive electrostatic stress relative to earth. Since the voltage source pad VDD is in a floating state (that is to say, in an abnormal state of operation), the positive stress applied through the bonding pad 32 results in a current to the voltage source pad VDD via the diode 36. The current flowing to the voltage source pad VDD is next transferred to the gate terminal of the PMOS transistor 44. Utilizing the overlap capacitor formed by the drain and the gate terminal of the PMOS transistor 44, the positive stress on the gate terminal of the PMOS transistor 44 is coupled to its drain terminal. Ultimately, the junction between the substrate and the source terminal of the NMOS transistor 40 is triggered to open the parasitic bipolar junction transistor in the NMOS transistor 40. Hence, the positive stress applied to the bonding pad 32 is discharged to earth pad VSS via the diode 36, the voltage source pad VDD and the NMOS transistor 40.

Similarly, if there is an electrostatic discharge, for example, a negative stress relative to the earth voltage VSS, the diode 38 becomes conductive and forms a discharge route between the bonding pad 32 and the earth voltage pad VSS. Hence, any negative stress applied to the bonding pad 32 is quickly relieved through a discharge to the earth voltage pad VSS.

Figure 5:
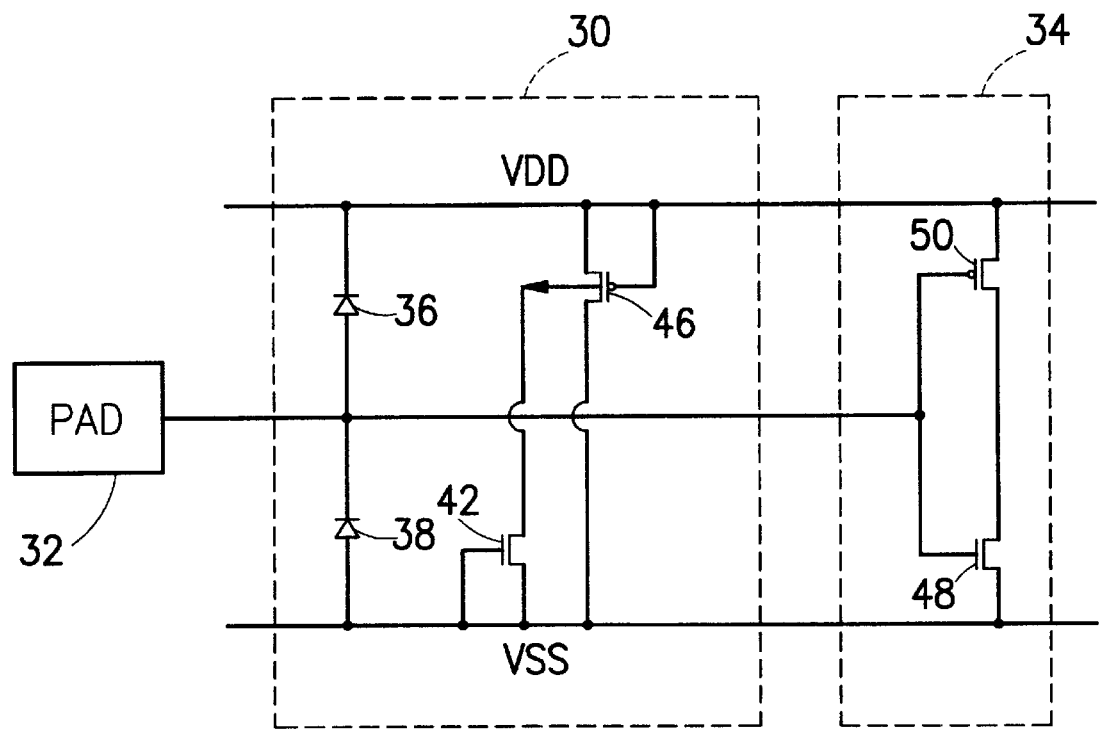
FIG. 5 is a circuit diagram showing the SOI ESD protection circuit of this invention under a negative electrostatic stress relative to a voltage source.

On the other hand, an electrostatic discharge due to a negative stress relative to the voltage source VDD may occur, for example. FIG. 5 is a circuit diagram showing the SOI ESD protection circuit of this invention under a negative electrostatic stress relative to a voltage source.

Similarly, since the earth pad VSS is in a floating state (that is to say, in an abnormal state of operation), the negative stress applied through the bonding pad 32 will result in a current to the earth pad VSS through the diode 38. The current flowing to the earth pad VSS is next transferred to the gate terminal of the NMOS transistor 42. Utilizing the overlap capacitor formed by the drain and the gate terminal of the NMOS transistor 42, the negative stress on the gate terminal of the NMOS transistor 42 is coupled to its drain terminal. Ultimately, the junction between the substrate and the source terminal of the PMOS transistor 46 is triggered to open the parasitic bipolar junction transistor in the PMOS transistor 46. Hence, the negative stress applied to the bonding pad 32 is discharged to the voltage source pad VDD via the diode 38, the earth pad VSS and the PMOS transistor 46.

The invention utilizes a substrate trigger SOI ESD protection circuit to open a bipolar junction transistor early on in the presence of ESD stress so that performance and robustness of ESD protection is increased. In addition, circuit structure of the invention is simple and hence occupies relatively little surface area.

In summary, a positive stress relative to the earth voltage or a negative stress relative to the voltage source is able to trigger the parasitic bipolar junction transistor inside the SOI ESD protection circuit into an open state early on. Hence, the electrostatic stress can be discharged to the earth or the voltage source through the triggering action at the junction between the substrate and the source region of the NMOS transistor 40 or the PMOS transistor 46. Discharging the ESD stress to the earth voltage pad VSS or the voltage source pad VDD, enhances performance and robustness of the ESD protection circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon-on-insulator (SOI) electrostatic discharge (ESD) protection circuit, which is installed between a bonding pad and an input buffer and SOI ESD protection circuit is coupled to the input buffer through a voltage source and an earth voltage, the SOI ESD protection circuit comprising:

a first diode, wherein an input terminal is coupled to the bonding pad and an output terminal is coupled to the voltage source;

a second diode, wherein an input terminal is coupled to the earth voltage and an output voltage is coupled to the bonding pad;

a first NMOS transistor, wherein a source terminal and a gate terminal are coupled to the earth voltage and a drain terminal is coupled to the voltage source;

a second NMOS transistor, wherein a source terminal and a gate terminal are coupled to the earth voltage;

a first PMOS transistor, wherein a source terminal and a gate terminal are coupled to the source voltage and a drain terminal is coupled to the substrate of the first NMOS transistor; and a second PMOS transistor, wherein a source terminal and a gate terminal are coupled to the voltage source, a drain terminal is coupled to the earth voltage and the substrate is coupled to the drain terminal of the second NMOS transistor.

2. The SOI ESD circuit of claim 1, wherein the input buffer comprises an NMOS transistor and a PMOS transistor serially connected together.

* * * * *